United States Patent [19]

Jeffery et al.

[11] Patent Number: 4,486,880
[45] Date of Patent: Dec. 4, 1984

[54] OUTPUT MULTIPLEXER HAVING ONE GATE DELAY

[75] Inventors: Philip A. Jeffery, Mesa; L. J. Reed, Gilbert; Harold L. Spangler, Mesa, all of Ariz.

[73] Assignee: Motorola, Inc., Schaumburg, Ill.

[21] Appl. No.: 447,928

[22] Filed: Dec. 9, 1982

[51] Int. Cl.³ ............................................. H04J 15/00
[52] U.S. Cl. .................................... 370/112; 307/243
[58] Field of Search ................ 370/112; 307/243, 241, 307/242, 455; 328/97

[56] References Cited

U.S. PATENT DOCUMENTS 3,838,296 9/1974 McLeod ............................. 370/112

Primary Examiner—Douglas W. Olms
Assistant Examiner—Kenneth I. Rokoff
Attorney, Agent, or Firm—William E. Koch

[57] ABSTRACT

A multiplexer comprises a select circuit having a plurality of OR gates responsive to digital select signals. Transistors within the OR gates are collector dotted and provide a plurality of select circuit outputs to a plurality of AND gates which are also responsive to a plurality of input signals. The collector dotting of the four OR gates of the select circuit provides a multiplexer having a single gate delay of data transmission. The multiplexer consumes less current by having only a single current source for the AND gates.

5 Claims, 3 Drawing Figures

OUTPUT MULTIPLEXER HAVING ONE GATE DELAY

BACKGROUND OF THE INVENTION

1. Field of the Invention

This invention relates, in general, to an output multiplexer and more particularly to a four-to-one output multiplexer having only a one gate delay for the data transmission.

2. Background Art

Output multiplexers are well known in the art. Typical multiplexers comprise a plurality of gates, each responsive to an input signal, and at least one select output from a select circuit comprising a plurality of gates. The select circuit is responsive to a plurality of digital inputs, thereby determining which of the inputs to the first plurality of gates controls the state of the output.

One well known four-to-one multiplexer circuit includes two OR gates responsive to a pair of select signals having first and second states, each OR gate having a first output representative of the first state and a second output representative of the second state. Four NOR gates, each responsive to an input and to one select output from each of the NOR gates, are connected to a fifth NOR gate for providing an output.

The known prior art has a two gate delay for data transmission, a three gate delay for select transmission, and typically has seven current sources.

Thus, a need exists for an improved multiplexer having fewer gate delays for the data transmission and a reduction in current by using a single current source.

SUMMARY OF THE INVENTION

Accordingly, it is an object of the present invention to provide an improved output multiplexer.

Another object to the present invention is to provide an output multiplexer having only one gate delay for the data transmission.

A further object to the present invention is to provide an output multiplexer having reduced current requirements.

In carrying out the above and other objects of the invention in one form, there is provided an improved output multiplexer having a plurality of input conductors, each responsive to an input having a first and second state, and a plurality of select conductors, each responsive to a select signal, for selecting one input for determining the state of an output. A select circuit includes a plurality of gates, wherein each of the input conductors are coupled to at least two of the gates. Each of the gates has a first gate output having a first and second state and a second gate output having a first and second state, wherein the first and second gate outputs provide a plurality of select outputs. A multiplexer gate is coupled to the plurality of input conductors and the select circuit and is responsive to the select outputs for determining which of the inputs determines the state of an output.

The above and other objects, features, and advantages of the present invention will be better understood from the following detailed description taken in conjunction with accompanying drawings.

DETAILED DESCRIPTION OF THE INVENTION

Figure 1:
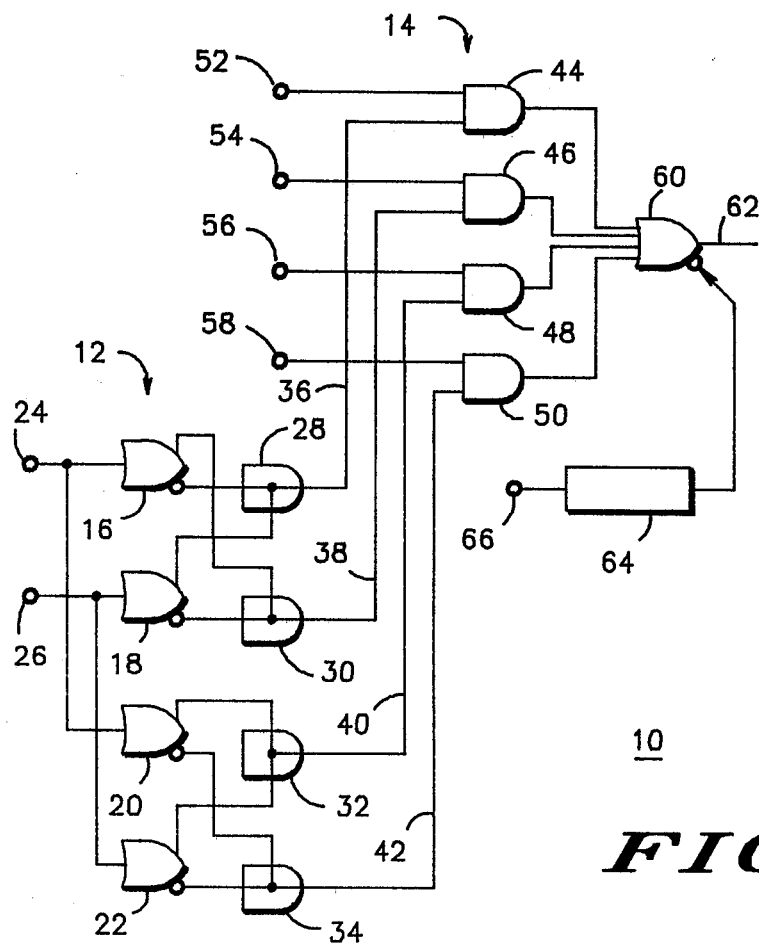
FIG. 1 illustrates in logic diagram form the preferred embodiment of the present invention.

Referring to FIG. 1, an output multiplexer 10 is shown which is suitable to be fabricated in monolithic integrated circuit form as well as with discrete components. Multiplexer 10 includes a select circuit 12 and multiplexer circuit 14. Select circuit 12 includes four OR gates 16, 18, 20, 22 which are responsive to select signals. OR gates 16 and 20 are connected to select input conductor 24 and OR gates 18 and 22 are connected to select input conductor 26. Or gate 16 has an output connected as an input to AND gate 30, and an inverse output connected as an input to AND gate 28. OR gate 18 has an output connected as an input to AND gate 28, and an inverse output connected as an input to AND gate 30. OR gate 20 has an output connected as an input to AND gate 32, and an inverse output connected as an input to AND gate 34. OR gate 22 has an output connected as an input to AND gate 32, and an inverse output connected as an input to AND gate 34.

AND gates 28, 30, 32, 34 are representative of transistor collector dotted circuitry that will be discussed in further detail by referring to FIG. 2 and are not gates in the typical sense. This collector dotted circuitry provides for a reduced gate delay over the data transmission of the previously known circuitry.

Digital select signals having high and low states are applied to conductors 24 and 26, thereby providing a digital high on only one of the select circuit outputs 36, 38, 40, 42 which are outputs of AND gates 28, 30, 32, and 34, respectively.

Multiplexer circuit 14 includes AND gates 44, 46, 48, 50, each having an input connected to select circuit outputs 36, 38, 40, 42, respectively. A second input to each of AND gates 44, 46, 48, 50, are connected to multiplexer input conductors 52, 54, 56, 58, respectively. AND gates 44, 46, 48, 50 each have an output connected as an input to OR gate 60. Output conductor 62 from OR gate 60 provides the output for multiplexer 10. Output enable circuit 64 is connected to OR gate 60 and to enable conductor 66.

Figure 2A:
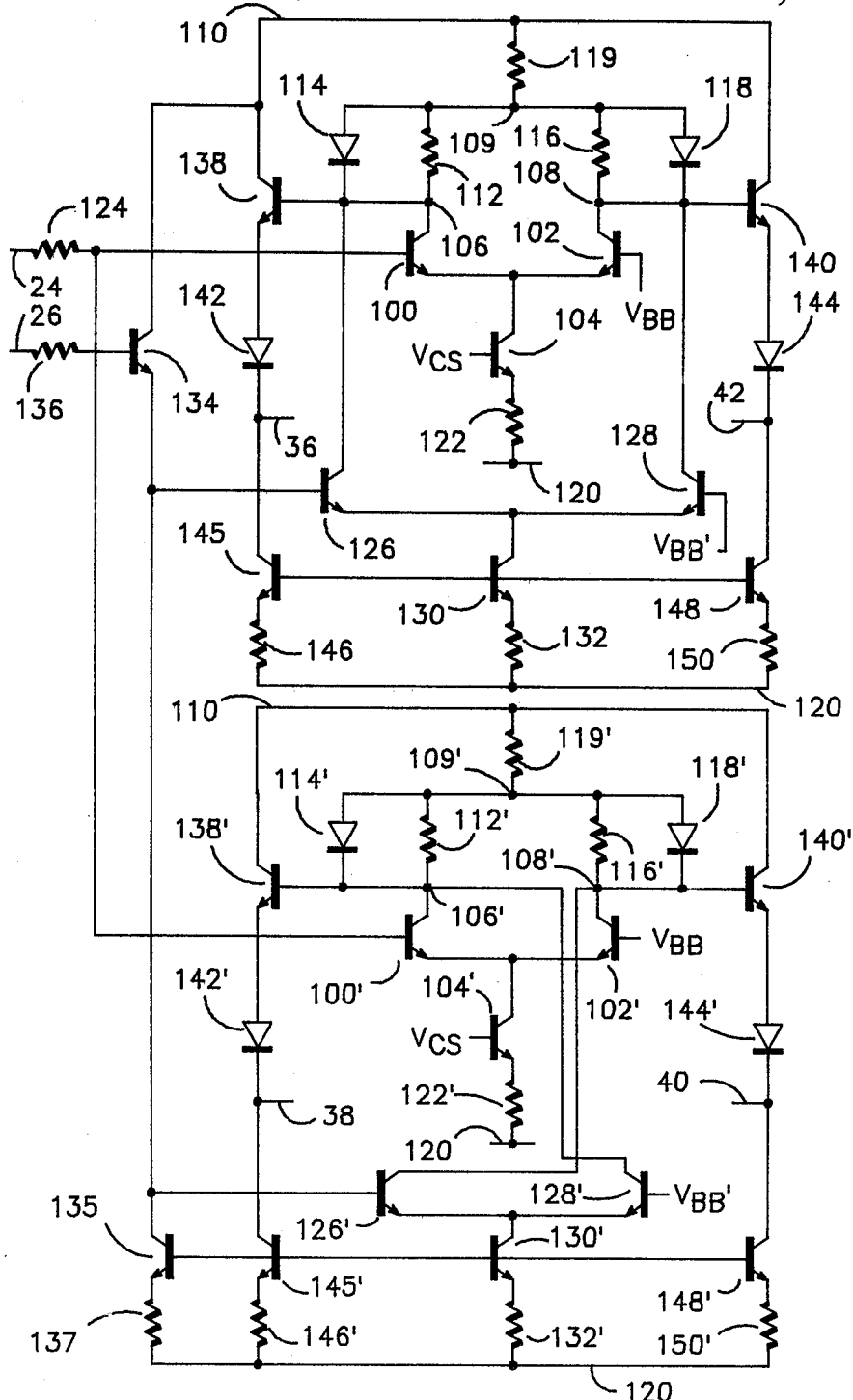
FIGS. 2A and 2B illustrate in schematic form the preferred embodiment of the present invention.
Figure 2B:
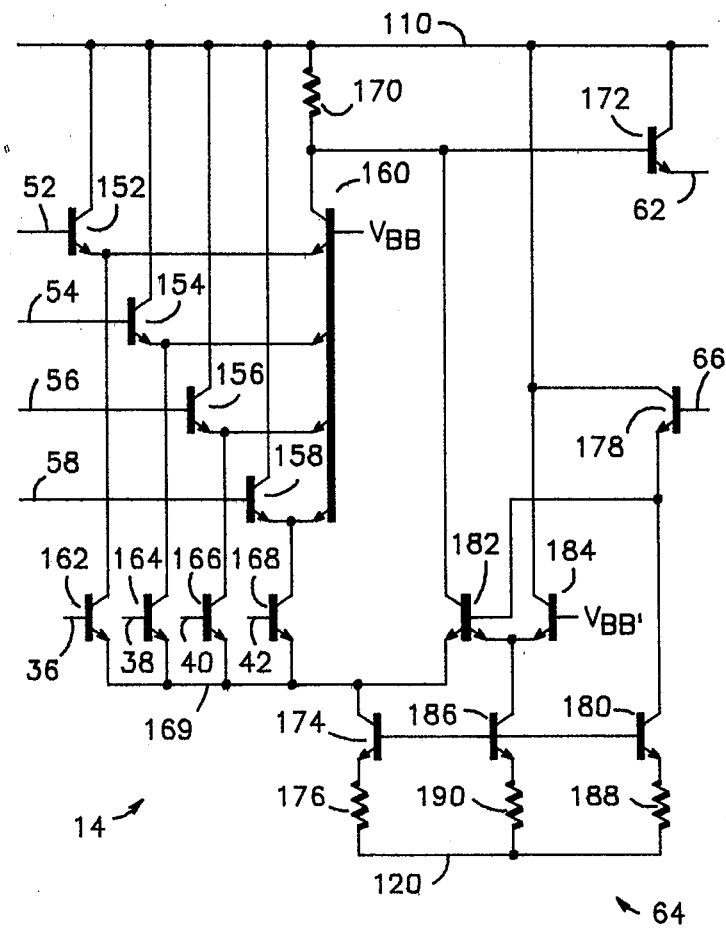

Referring now to FIGS. 2A and 2B, select circuit 12 includes differentially connected NPN transistors 100 and 102, both having their emitters connected to the collector of current source transistor 104. The collectors of transistors 100 and 102 are connected to nodes 106 and 108, respectively. Node 106 is coupled to node 109 by resistor 112 and is connected to the cathode of diode 114. Node 108 is coupled to node 109 by resistor 116 and is connected to the cathode of diode 118. The anodes of diodes 114 and 118 are connected to node 109. Node 109 is coupled to first supply voltage conductor 110 by resistor 119. Transistor 104 has its base connected to current source voltage $V_{CS}$ and its emitter coupled to second supply voltage conductor 120 by resistor 122. The base of transistor 102 is connected to reference voltage $V_{BB}$ and the base of transistor 100 is coupled to select input conductor 24 by resistor 124.

Differentially connected transistor 100 and 102 function as a switch. For example, when a digital high signal appears on conductor 24, transistor 100 turns on, thereby pulling node 106 low. Transistor 102 is off, thereby causing node 108 to be high. When a low digital signal appears on conductor 24, transistor 100 is off and transistor 102 is on, thereby causing node 106 to be high and node 108 to be low.

Differentially connected NPN transistors 126 and 128 have their collectors connected to nodes 106 and 108, respectively. Both of the emitters of transistors 126 and 128 are connected to the collector of current source transistor 130. The emitter of transistor 130 is coupled to second supply voltage conductor 120 by resistor 132. The base of transistor 128 is connected to reference voltage $V_{BB}'$ and the base of transistor 126 is connected to the emitter of input translator transistor 134. The collector of transistor 134 is connected to first supply voltage conductor 110 and the base is coupled to select input conductor 26 by resistor 136. The emitter of transistor 134 is connected to the collector of current source transistor 135. The emitter of transistor 135 is coupled to second supply voltage conductor 120 by resistor 137.

Differentially connected transistors 126 and 128 function as a switch similarly to differentially connected transistors 100 and 102. When a digital high signal appears on conductor 26, transistor 134 is turned on, thereby turning on transistor 126 and pulling node 106 low. When a low digital signal appears on conductor 26, transistors 134 and 126 are both off, thereby causing node 106 to be high. Therefore, it is seen that node 106 is high only when both the transistors 100 and 126 are off and node 106 will be low when either of transistors 100, 126 are on. Furthermore, node 108 is high when transistors 102 and 128 are both off and is low when either of transistors 102, 128 are on.

Node 106 is further connected to the base of output translator transistor 138 and node 108 is connected to the base of output translator transistor 140. The collectors of transistors 138 and 140 are both connected to first voltage supply conductor 110. The emitter of transistor 138 is connected to the anode of diode 142 and the emitter of transistor 140 is connected to the anode of diode 144. The cathode of diode 142 is connected to select output 36 and to the collector-of current source transistor 145. The emitter of transistors 145 is coupled to second voltage supply conductor 120 by resistor 146. The cathode of diode 144 is connected to select circuit output 42 and to the collector of current source transistor 148. The emitter of current source transistor 148 is coupled to second supply voltage conductor 120 by resistor 150 and its base is connected to the bases of transistors 130 and 145.

It is readily seen that when node 106 is high, select output follower conductor 36 goes high. When node 108 is high, select output follower conductor 42 goes high.

Most of the remaining portion of select circuit 12 is constructed similar to the portion just discussed. Prime numbers will be used for clarity of description where the circuit elements are similar. Differentially connected transistors 100' and 102' have both of their emitters connected to the collector of current source transistor 104'. The collector of transistor 100' is connected to node 106' and the collector of transistor 102' is connected to node 108'. Node 106' is coupled to node 109' by resistor 112' and is connected to the cathode of diode 114'. Node 108' is coupled to node 109' by resistor 116' and is connected to the cathode of diode 118'. The anodes of diodes 114' and 118' are connected to node 109'. Node 109' is coupled to first supply voltage conductor 110 by resistor 119'. The emitter of transistor 104' is coupled to second supply voltage conductor 120 by resistor 122' and its base is connected to current supply voltage $V_{CS}$. The base of transistor 100' is coupled to select input conductor 24 by resistor 124. The base of transistor 102' is connected to reference voltage $V_{BB}$.

Differentially connected transistors 126' and 128' have both of their emitters connected to the collector of current source transistor 130'. The emitter of transistor 130' is coupled to second supply voltage conductor 120 by resistor 132'. The base of transistor 128' is connected to reference voltage $V_{BB}'$. The base of transistor 126' is connected to the emitter of transistor 134.

Node 106' is connected to the base of output translator transistor 138' and node 108' is connected to the base of output translator transistor 140'. The collectors of transistors 138' and 140' are connected to first supply voltage conductor 110. The emitter of transistor 138' is connected to the anode of diode 142' and the emitter of transistor 140' is connected to the anode of diode 144'. The cathode of diode 142' is connected to select circuit output conductor 38 and the collector of transistor 145'. The emitter of transistor 145' is coupled to second supply voltage conductor 120 by resistor 146'. The cathode of diode 144' is connected to select circuit output conductor 40 and to the collector of transistor 148'. The emitter of transistor 148' is coupled to second supply voltage conductor 120 by resistor 150'. The base of transistor 148' is connected to the base of transistors 130', 135 and 145'.

The operation of select circuit 12 may be further understood by referring to the truth table as follows:

| Select Inputs on Conductors | | Select Circuit Outputs on Conductors | | | |
| --- | --- | --- | --- | --- | --- |
| 24 | 26 | 36 | 38 | 40 | 42 |
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

It may be seen, that a digital high will appear on only one of select circuit output conductors 36, 38, 40, and 42, depending on the digital input on select input conductors 24 and 26. For example, a digital low on conductors 24 and 26 will give a digital high on conductor 36 and a digital low on conductors 38, 40 and 42.

Multiplexer circuit 14 includes data transistors 152, 154, 156, and 158 having their bases connected to input conductors 52, 54, 56, and 58, respectively. The collectors of transistors 152, 154, 156, 158 are all connected to first supply voltage conductor 110. The emitter of transistor 152 is connected to a first emitter of gate transistor 160 and to the collector of select transistor 162. The emitter of transistor 154 is connected to a second emitter of transistor 160 and to the collector of select transistor 164. The emitter of transistor 156 is connected to a third emitter of transistor 160 and to the collector of select transistor 166. The emitter of transistor 158 is connected to a fourth emitter of transistor 160 and to the collector of select transistor 168. The base of transistor 160 is connected to reference voltage $V_{BB}$ and the collector is coupled to first supply voltage conductor 110 by load resistor 170. The emitters of transistors 162, 164, 166, 168, are connected to node 169. The bases of transistors 162, 164, 166, 168, are connected to select circuit output conductors 36, 38, 40, 42, respectively. Current source transistor 174 has its collector connected to node 169 and its emitter coupled to second supply voltage conductor 120 by resistor 176. Output transistor 172 has its collector connected to first supply voltage conductor 110 and its base connected to the collector of transistor 160. The emitter of transistor 172 is connected to output conductor 62.

In operation, it may be seen that a digital high on the appropriate select circuit output conductor 36, 38, 40, 42 will transfer the appropriate digital input information on input conductor 52, 54, 56, 58 to the output conductor 62. For example, if a digital high exists on select circuit output conductor 36 and input conductor 52, transistors 152 and 162 are both on. Therefore, transistor 160 is off and a high voltage appears at the base of transistor 172, causing conductor 62 to go high. Since reference voltage $V_{BB}$ is greater than the signal on input conductors 54, 56, 58, transistors 154, 156, 158 will be off. However, remembering that select output conductor 36 is high and since only one select output conductor 36, 38, 40, and 42 may be high at a given time, transistors 164, 166, 168 are off and the second, third, and fourth emitters of transistor 160 cannot draw current from resistor 170.

Furthermore, by example, if a digital high is on input conductor 52 and a digital low is on select output conductor 36, transistor 152 is effectively off. A digital high would then appear on one of the select circuit output conductors 38, 40, or 42. If the high signal was appearing at select circuit output conductor 42, transistor 168 would be on, allowing the input signal on conductor 58 to be seen at output conductor 62.

Output enable circuit 64 includes transistor 178 having its base connected to enable input conductor 66. The collector of transistor 178 is connected to first supply voltage conductor 110 and its emitter is connected to the collector of current source transistor 180. Transistors 182 and 184 are differentially connected, wherein a first emitter of transistor 182 and the emitter of transistor 184 are connected to the collector of current source transistor 186. The emitters of transistors 180 and 186 are coupled to second voltage source conductor 120 by resistors 188 and 190, respectively. The base of transistor 186 is connected to the bases of transistors 180 and 174. The collector of transistor 184 is connected to first supply voltage conductor 110 and the collector of transistor 182 is connected to the base of transistor 172. A second emitter of transistor 182 is connected to node 169.

The output of multiplexer 10 is determined by the voltage across resistor 170. A digital low appearing on enable conductor 66 will cause transistor 182 to be off. The reference voltage $V_{BB}'$ on the base of transistor 184 causes transistor 184 to be on and current to flow through transistor 184, 186 and resistor 190. A digital high on output enable conductor 66 causes transistor 182 to turn on. The current previously flowing through transistor 184 is now diverted to transistor 182. The current previously flowing through the appropriate data transistor 152, 154, 156, 158 and the appropriate select transistor 162, 164, 166, 168 is also diverted to flow through transistors 182, 174 and resistors 170, 176. The additional current now flowing through resistor 170 causes the signal on the base of transistor 172 to be very low, thus turning off transistor 172 and disabling output conductor 62.

By now it should be appreciated that there has been provided an output multiplexer that reduces the gate delay of the data transmission and lowers current requirements.

We claim:

1. A multiplexer having a plurality of input conductors each responsive to an input having a first and second state and a plurality of select conductors each responsive to a select signal, for providing an output, comprising:

a select circuit comprising a plurality of gates, each of said input conductors coupled to at least two of said gates, each of said gates having a first gate output having a first and second state and a second gate output having a first and second state, each of said gates comprising differentially coupled transistors, each of said transistors having a collector, each of said collectors providing one of said first and second gate outputs, said collectors dotted with collectors of another one of said transistors so as to provide a plurality of select outputs; and a multiplexer gate coupled to said plurality of input conductors and said select circuit and responsive to said select outputs for determining said output.

2. A multiplexer having four input conductors, each responsive to an input, and two select conductors, each responsive to a select signal, for providing an output, comprising:

a select circuit comprising:

a first gate coupled to a first of said select conductors for providing a first gate signal and a first gate inverse signal;

a second gate coupled to said first of said select conductors for providing a second gate signal and a second gate inverse signal;

a third gate coupled to a second of said select conductors for providing a third gate signal and a third gate inverse signal; and a fourth gate coupled to said second of said select conductors for providing a fourth gate signal and a fourth gate inverse signal, said first gate inverse signal being combined with said third gate signal to provide a first select output, said first gate signal being combined with said third gate inverse signal to provide a second select output, said second gate signal being combined with said fourth gate signal to provide a third select output, said second gate inverse signal being combined with said fourth gate inverse signal to provide a fourth select output; and a multiplexer gate coupled to said four input conductors and said select circuit and responsive to said first through fourth select outputs for providing said output, said output having a first and second state.

3. The multiplexer according to claim 2 wherein said first, second, third, and fourth gates each comprise a first and second differentially connected transistor, a collector of said first transistor of said first gate being coupled to a collector of said first transistor of said second gate, a collector of said second transistor of said first gate being coupled to a collector of said second transistor of said second gate, a collector of said first transistor of said third gate being coupled to a collector of said first transistor of said fourth gate, a collector of said second transistor of said third gate being coupled to a collector of said second transistor of said fourth gate.

4. The multiplexer according to claim 2 wherein said multiplexer gate comprises:

a fifth gate coupled to said first gate and a first of said four input conductors;

a sixth gate coupled to said second gate and a second of said four input conductors;

a seventh gate coupled to said third gate and a third of said four input conductors;

an eighth gate coupled to said fourth gate and a fourth of said four input conductors; and a ninth gate coupled to said fifth, sixth, seventh, and eighth gate for providing said output.

5. The multiplexer according to claim 4 further comprising an enabling circuit responsive to an enable signal, said enabling circuit diverting current from said multiplexer gate when enabled.

* * * * *